(12) United States Patent
Wei et al.

(10) Patent No.: US 11,443,941 B2
(45) Date of Patent: Sep. 13, 2022

(54) SILICON ON INSULATOR STRUCTURE AND METHOD OF MAKING THE SAME

(71) Applicants: Zing Semiconductor Corporation, Shanghai (CN); SHANGHAI INSTITUTE OF MICROSYSTEM AND INFORMATION TECHNOLOGY, CHINESE ACADEMY OF SCIENCES, Shanghai (CN)

(72) Inventors: Xing Wei, Shanghai (CN); Nan Gao, Shanghai (CN); Zhongying Xue, Shanghai (CN)

(73) Assignees: Zing Semiconductor Corporation, Shanghai (CN); SHANGHAI INSTITUTE OF MICROSYSTEM AND INFORMATION TECHNOLOGY, CHINESE ACADEMY OF SCIENCES, Shanghai (CN)

( * ) Notice: Subject to any disclaimer, the term of this patent is extended or adjusted under 35 U.S.C. 154(b) by 0 days.

(21) Appl. No.: 17/161,318

(22) Filed: Jan. 28, 2021

(65) Prior Publication Data
US 2022/0181150 A1  Jun. 9, 2022

(30) Foreign Application Priority Data

Dec. 8, 2020 (CN) .......................... 202011445232.X

(51) Int. Cl.
*H01L 21/02* (2006.01)
*H01L 21/306* (2006.01)
*H01L 21/762* (2006.01)

(52) U.S. Cl.
CPC .. *H01L 21/02422* (2013.01); *H01L 21/02664* (2013.01); *H01L 21/30604* (2013.01); *H01L 21/7624* (2013.01)

(58) Field of Classification Search
CPC ......... H01L 21/02422; H01L 21/03664; H01L 21/30604; H01L 21/7624
See application file for complete search history.

(56) References Cited

U.S. PATENT DOCUMENTS

| | | | | |
|---|---|---|---|---|
| 6,489,241 B1 * | 12/2002 | Thilderkvist | ....... | C23C 16/0236 216/52 |
| 2006/0128075 A1 * | 6/2006 | Kwon | ............... | H01L 21/76243 438/149 |
| 2010/0081253 A1 * | 4/2010 | Kurata | .............. | H01L 21/76254 438/458 |

* cited by examiner

*Primary Examiner* — Dale E Page
*Assistant Examiner* — Quovaunda Jefferson
(74) *Attorney, Agent, or Firm* — Chen Yoshimura LLP

(57) ABSTRACT

A method of making a silicon on insulator structure comprises: providing a bonded structure, the bonded structure comprises the first substrate, the second substrate and the insulating buried layer, the insulating buried layer is positioned between the first substrate and the second substrate; peeling off a layer of removing region of the first substrate from the bonded structure to obtain a first film; at a first temperature, performing a first etching to etch the first film to remove a first thickness of the first film; at a second temperature, performing a second etching to etch the first film to planarize the first film and remove a second thickness of the first film, the first temperature being lower than the second temperature, the first thickness being greater than the second thickness, and a sum of the first thickness and the second thickness being a total etching thickness of the first film.

11 Claims, 4 Drawing Sheets

```
┌─────────────────────────────────────────────────────────────┐
│   providing a bonded structure, the bonded structure comprises the first │
│   substrate, the second substrate and the insulating buried layer, the   │──S1
│   insulating buried layer is positioned between the first substrate and the │
│                        second substrate;                    │
└─────────────────────────────────────────────────────────────┘
                               ▼
┌─────────────────────────────────────────────────────────────┐
│   peeling off a layer of removing region of the first substrate from the │──S2
│             bonded structure to obtain a first film;        │
└─────────────────────────────────────────────────────────────┘
                               ▼
┌─────────────────────────────────────────────────────────────┐
│   at a first temperature, performing a first etching to etch the first film to │──S3
│             remove a first thickness of the first film;     │
└─────────────────────────────────────────────────────────────┘
                               ▼
┌─────────────────────────────────────────────────────────────┐
│   at a second temperature, performing a second etching to etch the first film │
│   to planarize the first film and remove a second thickness of the first film, │
│   the first temperature being lower than the second temperature, the first │──S4
│   thickness being greater than the second thickness, and a sum of the first │
│   thickness and the second thickness being a total etching thickness of the │
│                          first film.                        │
└─────────────────────────────────────────────────────────────┘
```

FIG. 1

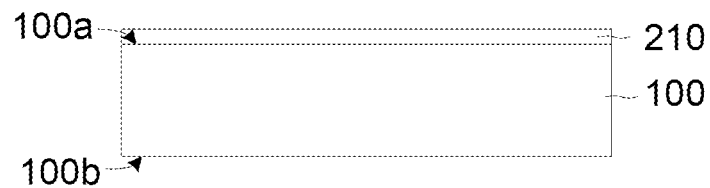

FIG. 2A

SILICON ON INSULATOR STRUCTURE AND METHOD OF MAKING THE SAME

FIELD OF THE INVENTION

The present invention generally relates to a semiconductor manufacturing technology field, and specifically, relates to a silicon on insulator (SOI) structure and method of making the same.

BACKGROUND OF THE INVENTION

Silicon-On-Insulator (SOI) is formed by an insulating buried layer positioned between a top-layer silicon and a substrate, and it means silicon transistors are formed above insulator by interposing insulation material between the silicon transistors. Then, parasitic capacitors therebetween may be cut to a half. Advantages of SOI materials are: achieving medium isolation of devices in an integrated circuit to eliminate parasitic latch-up effect in bulk silicon CMOS circuit thoroughly; and low parasitic capacitance, high integrated density, high speed, simple process, low short-channel effect and prone to low-voltage low-power-consumption application for an integrated circuit made with such materials. Further, SOI materials are used to make MEMS light switch with bulk micromachining technology.

For SOI materials, uniformity of the top-layer silicon is a key parameter which affect greatly on performance of devices. During SOI process, chemical mechanical polishing (CMP) is commonly used to planarize the top-layer silicon. However, current CMP cannot fulfill the required uniformity of the top-layer silicon.

To solve this problem, taking HCl as etching gas and setting high temperature as reaction condition to planarize the top-layer silicon are applied. These measures still fail in bad uniformity of the top-layer silicon because of etching rate difference of HCl between periphery and center regions of the silicon wafer.

SUMMARY OF THE INVENTION

In the summary of the invention, a series of concepts in a simplified form is introduced, which will be described in further detail in the detailed description. This summary of the present invention does not intend to limit the key elements or the essential technical features of the claimed technical solutions, nor intend to limit the scope of the claimed technical solution.

The present invention provides a silicon on insulator (SOI) structure and method of making the same to improve uniformity of a top-layer silicon when planarizing the top-layer silicon.

To solve one of above-mentioned problems, an aspect of the invention is to provide a method of making a silicon on insulator, comprising steps of: Step S1: providing a bonded structure, the bonded structure comprises the first substrate, the second substrate and the insulating buried layer, the insulating buried layer is positioned between the first substrate and the second substrate; Step S2: peeling off a layer of removing region of the first substrate from the bonded structure to obtain a first film; Step S3: at a first temperature, performing a first etching to etch the first film to remove a first thickness of the first film; and Step S4: at a second temperature, performing a second etching to etch the first film to planarize the first film and remove a second thickness of the first film, the first temperature being lower than the second temperature, the first thickness being greater than the second thickness, and a sum of the first thickness and the second thickness being a total etching thickness of the first film.

In accordance with some embodiments, optionally, Step S3 may comprise: performing the first etching to etch the first film to remove the first thickness of the first film with a first etching gas, using hydrogen as a first carrier gas, in a rapid thermal annealing (RTA) equipment or an epitaxy equipment.

In accordance with some embodiments, optionally, the first etching may be performed with parameters of: etching temperature being 900° C.~1000° C., flow of the first carrier gas being 40 slm~120 slm, and volume fraction of the first etching gas being lower than 1%.

In accordance with some embodiments, optionally, a proportion of the first thickness to the total etching thickness may be no greater than 70%.

In accordance with some embodiments, optionally, Step S4 may comprise: performing the second etching to planarize the first film to remove the second thickness of the first film with a second etching gas, using hydrogen as a second carrier gas, in a rapid thermal annealing (RTA) equipment or an epitaxy equipment.

In accordance with some embodiments, optionally, the second etching may be performed with parameters of: etching temperature being higher than 1050° C., flow of the second carrier gas being 40 slm~120 slm, volume fraction of the second etching gas being lower than 0.5%, and volume fraction of the second etching gas being lower than volume fraction of the first etching gas.

In accordance with some embodiments, optionally, both of the first etching gas and the second etching gas may comprise HCl gas.

In accordance with some embodiments, optionally, the bonded structure may be formed with steps comprises: providing the first substrate and the second substrate; growing a first oxide layer on a front surface of the first substrate; performing ion implantation from the front surface of the first substrate toward the first substrate to obtain a damaged layer; bonding the front surface of the first substrate and a front surface of the second substrate to form the bonded structure.

In accordance with some embodiments, optionally, when thickness of the insulating buried layer is smaller than 4000 Å, the insulating buried layer may comprise the first oxide layer. When thickness of the insulating buried layer is greater than 4000 Å, the insulating buried layer may comprise the first oxide layer and a second oxide layer, and during the growth of the first oxide layer on the front surface of the first substrate, the second oxide layer may be formed on the front surface of the second substrate.

In accordance with some embodiments, optionally, thickness of the first oxide layer may be 100 Å~4000 Å, and thickness of the second oxide layer may be 100 Å~30000 Å.

In accordance with some embodiments, optionally, Step S2 may comprises: performing a first annealing for the bonded structure, peeling off the bonded structure along with the damaged layer, and obtain the SOI structure constructed by the first film on the insulating buried layer, the second substrate, the insulating buried layer and the first film; performing a second annealing for the SOI structure; and rinsing a surface of the first film.

In accordance with some embodiments, optionally, the second annealing may be performed in oxygen-containing atmosphere, and a layer of silicon oxide may be grown on the surface of the first film; and the rinsing step may be used to remove the layer of silicon oxide.

Another aspect of the invention is to provide a SOI structure, made with the method mentioned above.

Effects compared with current technology are addressed here: the present invention provides a method of making a silicon on insulator (SOI) structure, comprising steps of: providing a bonded structure, the bonded structure comprises the first substrate, the second substrate and the insulating buried layer, the insulating buried layer is positioned between the first substrate and the second substrate; peeling off a layer of removing region of the first substrate from the bonded structure to obtain a first film; at a first temperature, performing a first etching to etch the first film to remove a first thickness of the first film; and at a second temperature, performing a second etching to etch the first film to planarize the first film and remove a second thickness of the first film, the first temperature being lower than the second temperature, the first thickness being greater than the second thickness, and a sum of the first thickness and the second thickness being a total etching thickness of the first film. Through etching at the first temperature to thin the first film, and planarizing the first film at the second temperature, the first film may present target thickness, and during planarization of a top-layer silicon, uniformity of thickness of the top-layer silicon may be improved.

BRIEF DESCRIPTION OF THE DRAWINGS

Various objects and advantages of the present invention will be more readily understood from the following detailed description when read in conjunction with the appended drawing, in which:

FIG. 1 shows a flow chart of a method of making a silicon on insulator (SOI) structure according to an embodiment of the invention;

FIGS. 2A~2I show cross-sectional views of a structure at each step of a method of making a SOI structure according to an embodiment of the invention;

DESCRIPTION OF EMBODIMENTS OF THE INVENTION

Figure 2B:
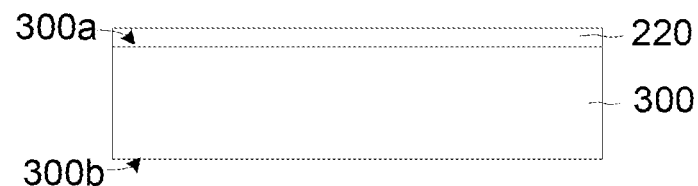

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

For a thorough understanding of the present invention, the detailed steps will be set forth in detail in the following description in order to explain the technical solution of the present invention. The preferred embodiments of the present invention is described in detail as follows, however, in addition to the detailed description, the present invention also may have other embodiments.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

It should be understood that the present invention may be practiced in different forms and that neither should be construed to limit the scope of the disclosed examples. On the contrary, the examples are provided to achieve a full and complete disclosure and make those skilled in the art fully receive the scope of the present invention. In the drawings, for clarity purpose, the size and the relative size of layers and areas may be exaggerated. In the drawings, same reference number indicates same element.

FIG. 1 shows a flow chart of a method of making a silicon on insulator (SOI) structure according to an embodiment of the invention. As shown in FIG. 1, a method of making a silicon on insulator may comprise steps of: Step S1: providing a bonded structure, the bonded structure comprises the first substrate, the second substrate and the insulating buried layer, the insulating buried layer is positioned between the first substrate and the second substrate; Step S2: peeling off a layer of removing region of the first substrate from the bonded structure to obtain a first film; Step S3: at a first temperature, performing a first etching to etch the first film to remove a first thickness of the first film; and Step S4: at a second temperature, performing a second etching to etch the first film to planarize the first film and remove a second thickness of the first film, the first temperature being lower than the second temperature, the first thickness being greater than the second thickness, and a sum of the first thickness and the second thickness being a total etching thickness of the first film.

Figure 2C:
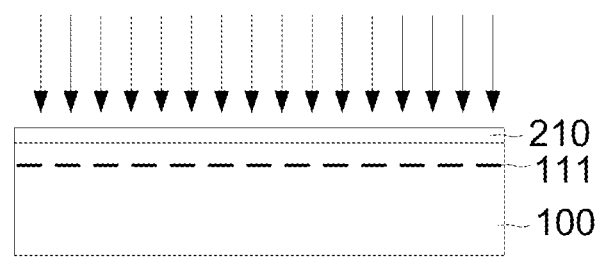
Figure 2D:
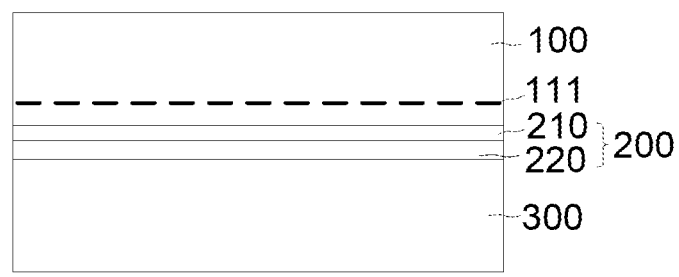

Referring to FIGS. 1 and 2A~2I to know further details of the method of making a SOI structure according to the present embodiment of the invention. FIG. 2A shows a cross-sectional view of the first substrate in the present embodiment. FIG. 2B shows a cross-sectional view of the second substrate in the present embodiment. FIG. 2C shows a cross-sectional view of the bonded structure after performing ion implantation in the present embodiment. FIG. 2D shows a cross-sectional view of the bonded structure in the present embodiment.

As shown in FIGS. 2A~2D, at first, Step S1 is performed to provide a bonded structure 10. The bonded structure 10 comprises the first substrate 100, the second substrate 300 and the insulating buried layer 200. The insulating buried layer 200 and the first substrate 100 are layered in order above the second substrate 300, i.e. the insulating buried layer 200 is positioned between the first substrate 100 and the second substrate 300.

The present step may comprise the following steps. As shown in FIGS. 2A and 2B, at first, the first substrate 100 and the second substrate 300 are provided. The first substrate 100 and the second substrate 300 may be bare substrate for example, and specifically, the first substrate 100 and the second substrate 300 may be bare silicon substrate; preferably, the shape of the first substrate 100 is identical to the shape of the second substrate 300, and the size of the first substrate 100 is identical to the size of the second substrate 300. The first substrate 100 may comprise a front surface 100a and a back surface 100b opposite to the front surface 100a; the second substrate 300 may comprise a front surface 300a and a back surface 300b opposite to the front surface 300a.

Then, when thickness of the insulating buried layer 200 is smaller than 4000 Å, the insulating buried layer 200 may only comprise the first oxide layer 210. At this time, the first oxide layer 210 may be grown on the front surface 100a of the first substrate, thickness of the first oxide layer 210 may be 100 Å~4000 Å for example, and the thickness of the insulating buried layer 200 is the thickness of the first oxide layer 210.

When the thickness of the insulating buried layer 200 is greater than 4000 Å, the insulating buried layer 200 may comprise the first oxide layer 210 and the second oxide layer 220, and at this time, the first oxide layer 210 may be grown on the front surface of the first substrate 100, and the thickness of the first oxide layer 210 may be 100 Å~4000 Å for example; meanwhile, the second oxide layer 210 may be grown on the front surface 300a of the second substrate, and the thickness of the second oxide layer 210 may be 100 Å~30000 Å for example. The thickness of the insulating buried layer 200 may be a sum of the thickness of the first oxide layer 210 and the thickness of the second oxide layer 210. In the present embodiment, the thickness of the insulating buried layer 200 may be greater than 4000 Å, and therefore, the insulating buried layer 200 may comprise the first oxide layer 210 and the second oxide layer 220.

As shown in FIG. 2C, then, an ion implantation from the front surface 100a of the first substrate toward the first substrate 100 may be performed to obtain an ion implanted layer 111 of the first substrate 100.

In the present step, ion implantation is an important measure in semiconductor manufacturing technology to dope dopants in a semiconductor easily, especially at required position and depth. Besides, with ion implantation, it is capable to control dopants precisely to provide high repeatability, which cannot be provided by other doping technology. In the present embodiment, ion implantation may be performed from the surface of the first oxide layer 210 toward the first substrate 100 to form a damaged layer at a predetermined depth of the first substrate 100, i.e. the ion implanted layer 111, and then the first film may be peeled off and transferred at the ion implanted layer 111. The depth of the ions inside the first substrate 100, i.e. transferred thickness of the first film, depends on ion energy to perform the ion implantation. Therefore, the predetermined depth may be determined considering the transferred thickness of the first film, and the ion energy may be set to enough value to allow the ions reaching the predetermined depth inside the first substrate 100. In the present embodiment, the ion energy may be set as 10 KeV~200 KeV, dose may be 5.5/cm²~7.5/cm².

The ion implantation may be performed with hydrogen ions, helium ions, neon ions, argon ions, krypton ions, xenon ions, radon ions, or a kind of hydrogen ions together with another ion, for example, hydrogen and helium ions. When the ion implantation is performed with hydrogen and helium ions, the order to implant hydrogen and helium ions may be varied according to requirement. In the present embodiment, the order to implant hydrogen and helium ions may be hydrogen ions first and then helium ions for example, and the implant depth of helium ions may be greater than that of hydrogen ions.

Rinsing may be required due to coproduct when forming the first oxide layer 210 and the second oxide layer 220 and particle pollution caused by ion implantation to obtain clean surface for later bonding process. Therefore, the first substrate 100 and the second substrate 300 are rinsed to clean the surfaces of the first oxide layer 210 and the second oxide layer 220.

As shown in FIG. 2D, then, a surface of the first oxide layer 210 away from the front surface 100a of the first substrate and a surface of the second oxide layer 220 away from the front surface 300a of the second substrate are bonded to bond the front surface 100a of the first substrate and the front surface 300a of the second substrate to form the bonded structure 10.

Figure 2E:
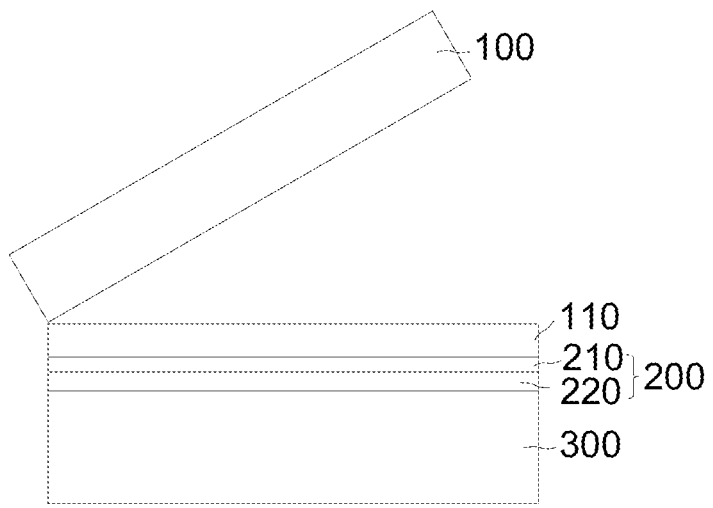

FIG. 2E shows a cross-sectional view of the SOI structure in the present embodiment.

Figure 2F:
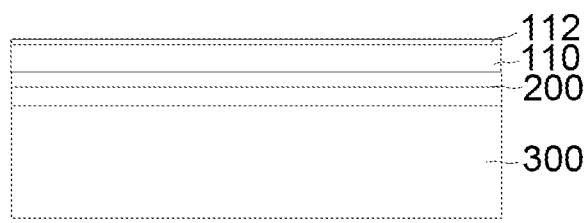

FIG. 2F shows a cross-sectional view of the SOI structure after performing a second annealing in the present embodiment.

Then, Step S2 is performed with peeling off a layer of removing region of the first substrate 100 from the bonded structure 10 to obtain a first film 110.

The present step may be specified to comprise details below. As shown in FIG. 2e, at first, a first annealing for the bonded structure 10 is performed. The bonded structure 10 is peeled off along with the ion implanted layer 111 (damaged layer) to obtain the first film 110 on the insulating buried layer 200 and the after-peeling-off first substrate 100. The first film 110 contributes to a part of the thickness of the first substrate 100, and the first substrate 100 after peeling off the first film 110 may be recycled to be used as the first substrate forming the bonded structure 10 next time. Together with the second substrate 300, the insulating buried layer 200 and the first film 110, the SOI structure 10' are formed. In the present embodiment, the temperature of the first annealing may be 400° C.~600° C., and time of annealing may not exceed 30 min.

As shown in FIG. 2F, then, the second annealing for the SOI structure 10' may be performed. The second annealing may be performed in oxygen-containing atmosphere, and physical chemical reaction may be taken place at the bonding interface to significantly increase bonding intensity. The temperature of the second annealing may be lower than 1250° C. During the second annealing, because the first film 110 may be exposed to oxygen-containing atmosphere, and therefore, silicon of the first film 110 may be reacted with oxygen, and a layer of silicon oxide 112 may be grown on the surface of the first film 110.

Figure 2G:
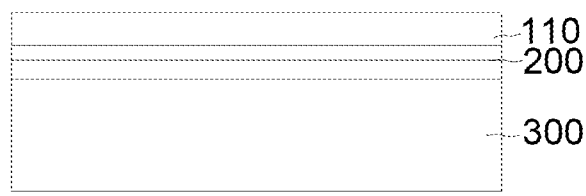

As shown in FIG. 2G, then, a rinsing step may be used to remove the layer of silicon oxide 112. The rinsing step may be introduced with hydrogen fluoride (HF) to remove the layer of silicon oxide 112.

After Step S2, then, the surface of the first film 110 is cleaned. Specifically, in a rapid thermal annealing (RTA) equipment or an epitaxy equipment, temperature may be set to above 1100° C., gas with reducibility such as hydrogen may be introduced, flow rate of the gas with reducibility may be 20 slm~100 slm, and cleaning time may be 30s~60s to remove nature oxide layer on the surface of the first film 110. Performing the present Step may ensure uniformity of silicon in the following HCl etching process.

Figure 2H:
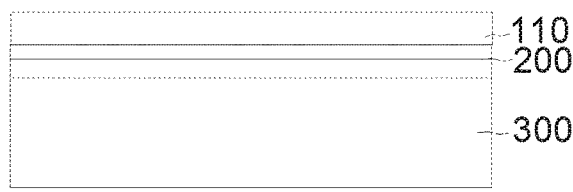

FIG. 2H shows a cross-sectional view of the SOI structure after removing the first thickness in the present embodiment. As shown in FIG. 2H, then Step S3 is performed. At the first temperature, a first etching to etch the first film 110 is performed to remove the first film 110 of the first thickness.

Specifically, as shown in FIG. 2H, the temperature of the RTA equipment or epitaxy equipment may be reduced to 900° C.~1000° C., for example, 900° C., 910° C., 920° C., 930° C., 940° C., 950° C., 960° C., 970° C., 980° C., 990° C., 1000° C., etc., and hydrogen gas may be the first carrier gas. Through a first etching gas, such as HCl gas, a reaction along with the first film 110 may be taken place. Flow rate of the first carrier gas may be 40 slm~120 slm, and preferably, the flow rate of the first carrier gas may be 60 slm~120 slm, and volume fraction of the first etching gas may be lower than 1%. Because the first etching is performed at the first temperature which is reached by temperature declining, etching rate difference between a periphery region and a center region of the first film 110 may be smaller. The volume fraction of the first etching gas may be greater, i.e. the first etching gas may be introduced with greater flow rate to accelerate etching, to obtain the first film 110 present almost target thickness. Therefore, the top-layer silicon (the first film 110) may present better uniformity in thickness after etching at the first temperature which is low and greater flow rate. A proportion of the first thickness to the total etching thickness is no greater than 70%.

Figure 2I:
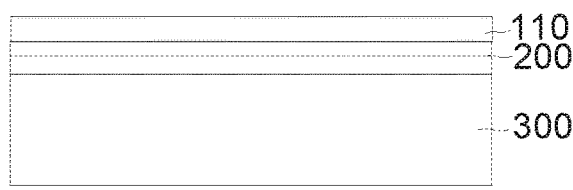

FIG. 2I shows a cross-sectional view of the SOI structure after removing the second thickness in the present embodiment. As shown in FIG. 2I, Step S4 is then performed. At the second temperature, the second etching to etch the first film 110 is performed to planarize the first film 110 and remove the second thickness of the first film 110. The first temperature may be lower than the second temperature, the first thickness may be greater than the second thickness, and the first thickness and the second thickness may be the total etching thickness of the first film 110.

Specifically, the temperature of the RTA equipment or epitaxy equipment may be raised to be higher than 1050° C., such as 1060° C., 1070° C., 1080° C., 1090° C., 1100° C., 1110° C., 1120° C., 1130° C., 1150° C., 1200° C., 1300° C. etc., with rising rate of 3° C./s~4° C./s. Hydrogen gas may be used as a second carrier gas. A second etching gas, such as HCl gas, and the first film 110, may be reacted. Flow rate of the second carrier gas may be 40 slm~120 slm, and preferably, the flow rate of the second carrier gas may be 60 slm~120 slm, volume fraction of the second etching gas may be lower than 0.5%, and the volume fraction of the second etching gas may be smaller than the volume fraction of the first etching gas. Because the second etching may be slowly performed with smaller flow rate after raising the temperature to the second temperature, the etching rate may be hardly affected by temperature. Because etching quantity may be smaller (the second thickness is thinner) at the second temperature, surface roughness of the first film may decrease along with the increasing of temperature, i.e. etching at high temperature may be beneficial to parnarization.

Figure 3:
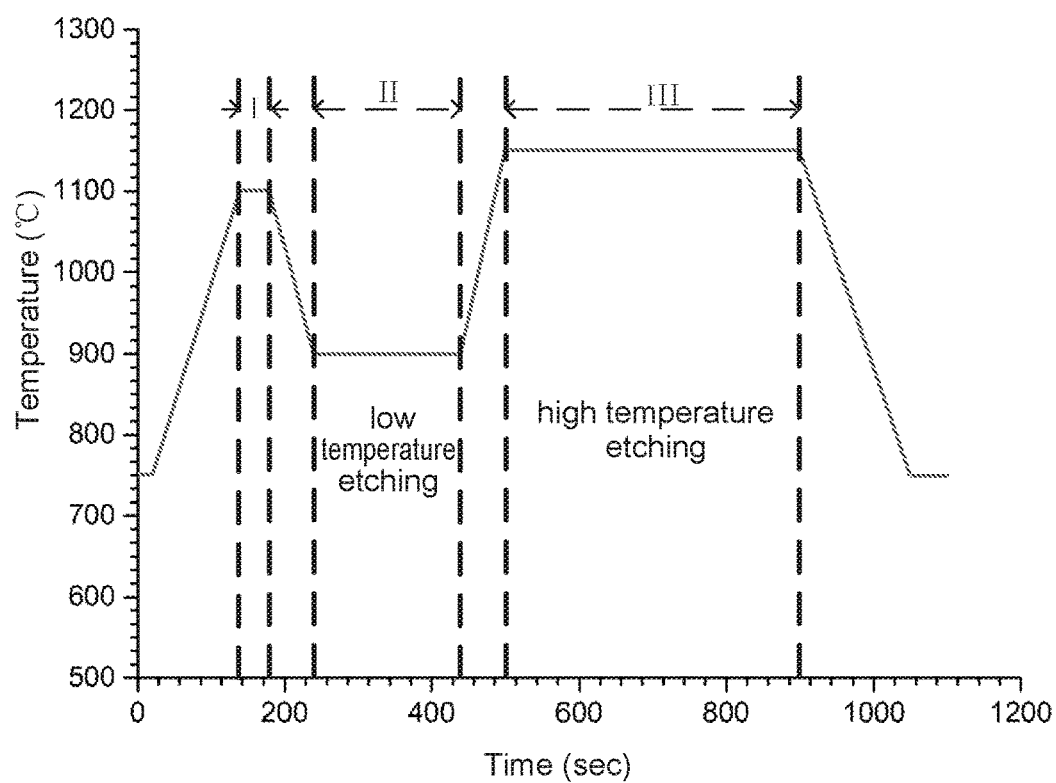
FIG. 3 shows a rinsing procedure according to an embodiment of the invention, presented with a temperature-time plot during the first etching and the second etching processes.

FIG. 3 shows a rinsing procedure in the present embodiment, presented with a temperature-time plot during the first etching and the second etching processes. As shown in FIG. 3, there are three time periods in the RTA equipment or epitaxy equipment: a first period I, a second period II, a third period III, in order. In the first period I, the SOI structure enters the equipment for rapid temperature raising to 1100° C., and stays at 1100° C. for seconds, and etching with hydrogen gas is performed to remove the layer of silicon oxide to clean the surface of the first film. In the second period II, temperature is decreased to 900° C., and the first film with uniform thickness throughout the periphery and center regions is obtained through the etching the most thickness of the first film (the first etching thickness) with the first etching gas introduced with great flow rate and thinning the thickness gradually in low temperature. In the third period III, temperature is rapidly raised to 1150° C., and thinning and planarization of the top-layer silicon is carried out through the etching a small portion of the thickness of the first film (the second etching thickness) with the second etching gas etching introduced with small flow rate. Within the duration, etching thickness ratio of the first temperature to the second temperature may be varied to adjust the planarization and uniformity of the thickness of the top-layer silicon.

In the present embodiment, a SOI structure, made with the method mentioned above may be provided.

To sum up, a silicon on insulator and a method of making the same are provided by the present invention. The method may comprise steps of: Step S1: providing a bonded structure, the bonded structure comprises the first substrate, the second substrate and the insulating buried layer, the insulating buried layer is positioned between the first substrate and the second substrate; Step S2: peeling off a layer of removing region of the first substrate from the bonded structure to obtain a first film; Step S3: at a first temperature, performing a first etching to etch the first film to remove a first thickness of the first film; and Step S4: at a second temperature, performing a second etching to etch the first film to planarize the first film and remove a second thickness of the first film, the first temperature being lower than the second temperature, the first thickness being greater than the second thickness, and a sum of the first thickness and the second thickness being a total etching thickness of the first film.

Further, please note that terms of "the first," "the second" used here are merely to identify elements, parts, steps, etc., but not intended to present logical relation or order of the elements, parts, steps, unless explanation or specific indication.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims and its equivalent systems and methods.

What is claimed is:

1. A method of making a silicon on insulator (SOI) structure, comprising steps of:
   Step S1: providing a bonded structure, the bonded structure comprises the first substrate, the second substrate and the insulating buried layer, the insulating buried layer is positioned between the first substrate and the second substrate;
   Step S2: peeling off a layer of removing region of the first substrate from the bonded structure to obtain a first film;
   Step S3: at a first temperature, performing a first etching to etch the first film to remove a first thickness of the first film; and
   Step S4: at a second temperature, performing a second etching to etch the first film to planarize the first film and remove a second thickness of the first film, the first temperature being lower than the second temperature, the first thickness being greater than the second thickness, and a sum of the first thickness and the second thickness being a total etching thickness of the first film;

wherein
the first etching is performed with parameters of: etching temperature being 900° C. 1000° C., flow of the first carrier gas being 40 slm~120 slm, and volume fraction of the first etching gas being lower than 1%;
the second etching is performed with parameters of: etching temperature being higher than 1050° C., flow of the second carrier gas being 40 slm~120 slm, volume fraction of the second etching gas being lower than 0.5%, and volume fraction of the second etching gas being lower than volume fraction of the first etching gas; and
both of the first etching gas and the second etching gas comprise HCl gas.

2. The method according to claim 1, wherein Step S3 comprises: performing the first etching to etch the first film to remove the first thickness of the first film with a first etching gas, using hydrogen as a first carrier gas, in a rapid thermal annealing (RTA) equipment or an epitaxy equipment.

3. The method according to claim 1, wherein a proportion of the first thickness to the total etching thickness is no greater than 70%.

4. The method according to claim 1, wherein Step S4 comprises: performing the second etching to planarize the first film to remove the second thickness of the first film with a second etching gas, using hydrogen as a second carrier gas, in a rapid thermal annealing (RTA) equipment or an epitaxy equipment.

5. The method according to claim 1, wherein the bonded structure is formed with steps comprises:
providing the first substrate and the second substrate;
growing a first oxide layer on a front surface of the first substrate;
performing ion implantation from the front surface of the first substrate toward the first substrate to obtain a damaged layer; and
bonding the front surface of the first substrate and a front surface of the second substrate to form the bonded structure.

6. The method according to claim 5, wherein when thickness of the insulating buried layer is smaller than 4000 Å, the insulating buried layer comprise the first oxide layer.

7. The method according to claim 5, wherein when thickness of the insulating buried layer is greater than 4000 Å, the insulating buried layer comprise the first oxide layer and a second oxide layer, and during the growth of the first oxide layer on the front surface of the first substrate, the second oxide layer is formed on the front surface of the second substrate.

8. The method according to claim 7, wherein thickness of the first oxide layer is 100 Å-4000 Å, and thickness of the second oxide layer is 100 Å-30000 Å.

9. The method according to claim 5, wherein Step S2 comprises:
performing a first annealing for the bonded structure, peeling off the bonded structure along with the damaged layer, and obtain the SOI structure constructed by the first film on the insulating buried layer, the second substrate, the insulating buried layer and the first film;
performing a second annealing for the SOI structure; and
rinsing a surface of the first film.

10. The method according to claim 9, wherein the second annealing is performed in oxygen-containing atmosphere, and a layer of silicon oxide is grown on the surface of the first film; and the rinsing step is used to remove the layer of silicon oxide.

11. A silicon on insulator (SOI) structure, made with the method according to claim 1.

* * * * *